(12) United States Patent
Baron et al.

(10) Patent No.: US 11,716,054 B2
(45) Date of Patent: Aug. 1, 2023

(54) TEMPERATURE-CONTROLLED RADIO-FREQUENCY RESONATOR AND CORRESPONDING RADIO-FREQUENCY OSCILLATOR

(71) Applicants: ECOLE NATIONALE SUPERIEURE DE MECANIQUE ET DES MICROTECHNIQUES—ENSMM, Besançon (FR); CENTRE NATIONAL DE LA RECHERCHE SCIENTIFIQUE—CNRS, Paris (FR)

(72) Inventors: Thomas Baron, Besançon (FR); Gilles Martin, Chatillon le Duc (FR); Valérie Soumann, Besançon (FR); Yannick Gruson, Saint-Vit (FR)

(73) Assignees: ECOLE NATIONALE SUPERIEURE DE MECANIQUE ET DES MICROTECHNIQUES—ENSMM, Besançon (FR); CENTRE NATIONAL DE LA RECHERCHE SCIENTIFIQUE—CNRS, Paris (FR)

( * ) Notice: Subject to any disclaimer, the term of this patent is extended or adjusted under 35 U.S.C. 154(b) by 0 days.

(21) Appl. No.: 17/620,829

(22) PCT Filed: May 28, 2020

(86) PCT No.: PCT/EP2020/064923
§ 371 (c)(1),
(2) Date: Dec. 20, 2021

(87) PCT Pub. No.: WO2020/254090
PCT Pub. Date: Dec. 24, 2020

(65) Prior Publication Data
US 2022/0311384 A1    Sep. 29, 2022

(30) Foreign Application Priority Data
Jun. 21, 2019 (FR) ...................................... 1906710

(51) Int. Cl.
*H03B 5/32* (2006.01)
*H03B 1/02* (2006.01)
(Continued)

(52) U.S. Cl.
CPC ................. *H03B 5/32* (2013.01); *H03B 1/02* (2013.01); *H03L 1/02* (2013.01); *H03L 1/04* (2013.01); *H03H 9/02448* (2013.01); *H03H 9/08* (2013.01)

(58) Field of Classification Search
CPC ... H03B 5/32; H03B 1/02; H03B 5/04; H03B 5/30; H03L 1/028; H03L 1/04;
(Continued)

(56) References Cited

U.S. PATENT DOCUMENTS 7,321,272 B2 * 1/2008 Neumann ............... H03L 1/028
                                                        331/116 R
2012/0305542 A1 * 12/2012 Donnay .................... H03L 1/04
                                                        219/412
(Continued)

FOREIGN PATENT DOCUMENTS

EP    2595315 A1 *  5/2013  ......... H03H 9/02448
JP    H0515520 U    2/1993

OTHER PUBLICATIONS

International Search Report dated Jul. 27, 2020 for corresponding International Application No. PCT/EP2020/064923, May 28, 2020.
(Continued)

*Primary Examiner* — Ryan Johnson
(74) *Attorney, Agent, or Firm* — David D. Brush; Westman, Champlin & Koehler, P.A.

(57) ABSTRACT

A temperature-controlled RF resonator. The resonator includes an insulating thermal enclosure within which are implemented: at least one resonant element configured to deliver an RF output signal when supplied with an RF input
(Continued)

signal; at least one heating element configured to supply thermal energy within the thermal enclosure when the at least one heating element is powered by an LF electric power signal; and at least one temperature sensor configured to deliver an LF electric measurement signal as a function of the temperature inside the thermal enclosure. Such an RF resonator has at least one input/output port crossing the insulating thermal enclosure and propagating at least: one signal from among the RF signals; and another signal from among the LF electric signals.

8 Claims, 3 Drawing Sheets

(51) Int. Cl.
    *H03L 1/02*     (2006.01)
    *H03L 1/04*     (2006.01)
    *H03H 9/02*     (2006.01)
    *H03H 9/08*     (2006.01)

(58) Field of Classification Search
CPC .. H03H 9/02448; H03H 9/08; H03H 9/02102; H03H 2003/027; H03H 2009/02181; G01K 7/245
See application file for complete search history.

(56) References Cited

U.S. PATENT DOCUMENTS

2017/0093361 A1     3/2017     Grosjean et al.
2017/0373693 A1    12/2017     Kondo

OTHER PUBLICATIONS

Written Opinion of the International Searching Authority dated Jul. 27, 2020 for corresponding International Application No. PCT/EP2020/064923, filed May 28, 2020.
International Preliminary Report on Patentability and English translation of the International Written Opinion for International Application No. PCT/EP2020/064923, filed May 28, 2020.

\* cited by examiner

TEMPERATURE-CONTROLLED RADIO-FREQUENCY RESONATOR AND CORRESPONDING RADIO-FREQUENCY OSCILLATOR

CROSS-REFERENCE TO RELATED APPLICATIONS

This Application is a Section 371 National Stage Application of International Application No. PCT/EP2020/064923, filed May 28, 2020, which is incorporated by reference in its entirety and published as WO 2020/254090 A1 on Dec. 24, 2020, not in English.

FIELD OF THE INVENTION

The field of the invention is that of precision frequency sources.

More particularly, the invention relates to a temperature controlled radio frequency (or RF) resonator and a corresponding RF oscillator.

The invention thus has many applications, whether for analogue applications, for example in domains requiring the generation of precision RF signals, or for digital applications, for example in domains requiring the generation of precision clocks. Examples include, but are not limited to, RF communications (e.g. cellular, military, space, etc.), banking transactions where high clock precision is required, etc.

Prior art and its disadvantages Frequency sources are needed to generate periodic signals of any kind, both for analogue (e.g. for RF carrier generation) and digital (e.g. for clock generation intended to clock digital flip-flop circuits) applications.

Many RF frequency sources are based on the use of one (or more) resonant elements to filter, around the resonant frequency of the resonant element in question, a periodic signal maintained within an oscillator. The use of such a resonant element makes it possible, in particular, to improve the phase noise performance of the periodic signal maintained by the oscillator via the filtering performed by the resonant element.

However, due to the physical nature of the resonant elements used in practice (e.g. MEMS (MicroElectroMechanical Systems), piezoelectric, SAW (Surface Acoustic Wave), BAW (Bulk Acoustic Wave), etc.), the resonant frequency of such a resonant element depends on its temperature. This is why known precision frequency sources use a temperature control of the resonant element that they implement.

Figure 1:
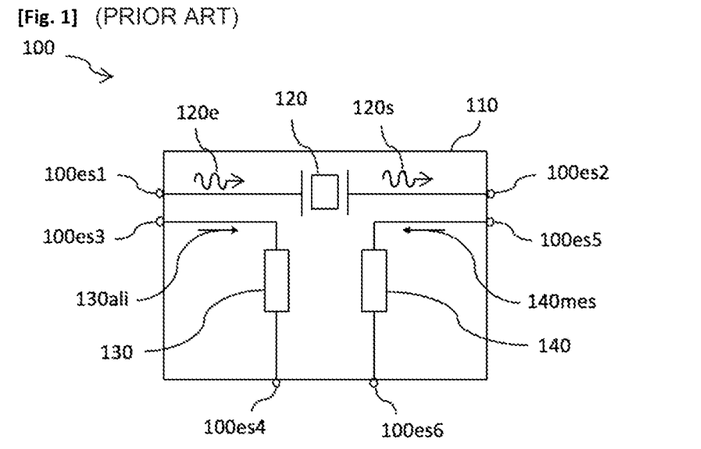
FIG. 1, already discussed above in connection with the section "Prior art and its disadvantages", illustrates a temperature controlled RF resonator according to a known implementation.

For example, FIG. 1 illustrates such a temperature controlled RF resonator 100 according to a known implementation. More particularly, the RF resonator 100 comprises a thermally insulating enclosure 110 within which are implemented:

a resonant element 120 configured to deliver an RF output signal 120s when supplied with an RF input signal 120e. More particularly, the RF output signal 120s corresponds to the RF input signal 120e filtered around the resonant frequency RF of the resonant element 120;

a heating element 130 configured to supply thermal energy within the thermal enclosure 110 when it is powered by a low frequency, or LF, electric power signal 130ali. For example, the heating element 130 is a resistor that produces heat by Joule effect when an electric current passes through it (electric current that corresponds in this case to the electric signal 130ali). In certain common implementations, it is desired that the electric signal 130ali be continuous, or DC, (for "Direct Current"). However, depending on the stability of the power supply used to generate the electric signal 130ali, the signal in question is again more generally LF, given that the LF terminology covers the ideal DC case according to the present application. Furthermore, in some common implementations, such an electric signal 130ali is intended to be slaved via a servo loop. This is, for example, the case in the configuration of the oscillator 300 described below in connection with FIG. 3. In this type of control, the electric signal 130ali varies over time, whether it is at the moment the servo loop is closed, or during changes of the control setpoint (e.g. to monitor the temperature variations measured by the temperature sensor 140). The spectrum of variations of the electric signal 130ali, in this implementation, is frequency-limited by the bandwidth of the servo loop. In practice, the variations in question are thus LF, as opposed to the RF resonant frequency of the resonator 100; and a temperature sensor 140 configured to deliver an LF electric measurement signal 140mes as a function of the temperature present inside the thermal enclosure 110. For example, the temperature sensor 140 is a temperature-dependent variable resistor. The LF electric measurement signal 140mes is, in this case, a current whose intensity is a function of the temperature when the temperature sensor 140 is subjected to a given potential difference.

Furthermore, the RF resonator 100 comprises six input/output ports 100es1 to 100es6 (a given input/output port being understood in the present application as comprising a single electric connection (e.g., a single conductor propagating the various incoming/outgoing signals). The six input/output ports 100es1 to 100es6 pass through the insulating thermal enclosure 110 so as to connect the various aforementioned elements electrically within the thermal enclosure 110 to an external electrical circuit, such as an oscillator for generating and maintaining the RF input signal 120e. More specifically:

the input/output port 100es1 is used to propagate the RF input signal 120e from outside the enclosure 110 to the resonant element 120;

the input/output port 100es2 is used to propagate the RF output signal 120s from the resonant element 120 to the exterior of the enclosure 110;

the input/output port 100es3, respectively the input/output port 100es4, is used to propagate the LF electric power signal 130ali from, respectively to, a power supply external to the enclosure 110 to, respectively from, the heating element 130;

the input/output port 100es5, respectively the input/output port 100es6, is used to propagate the LF electric measurement signal 140mes from, respectively to, the temperature sensor 140 to, respectively from, the outside of the enclosure 110.

Such an RF resonator 100 is typically embedded within an RF oscillator to generate a precision RF signal. However, such precision frequency sources are increasingly being used in applications in which the electric power consumption criterion is important, for example when they are embedded in a device that is energy autonomous, or has limited access to such energy resources (e.g., in a radio communication terminal, a satellite, a laptop computer, etc.).

There is therefore a need for a temperature-controlled RF resonator with reduced power consumption compared to known resonators.

SUMMARY OF THE INVENTION

In an embodiment of the invention, a temperature-controlled RF resonator is proposed comprising an insulating thermal enclosure within which are implemented:
- at least one resonant element configured to provide an RF output signal when fed with an RF input signal, the RF output signal corresponding to the RF input signal filtered around a resonant frequency of said at least one resonant element;
- at least one heating element configured to supply thermal energy within the thermal enclosure when said at least one heating element is powered by a low frequency, or LF, electric power signal; and
- at least one temperature sensor configured to deliver an LF electric measurement signal as a function of the temperature inside the thermal enclosure.

Such an RF resonator comprises at least one input/output port crossing the insulating thermal enclosure, said at least one input/output port propagating at least:
- one signal from among the RF signals; and
- another signal from among the LF electric signals.

Thus, the invention provides a novel and inventive solution for reducing the electrical power consumption of a temperature controlled RF resonator.

In particular, the reuse of input/output ports (a given input/output port being understood as comprising a single electric connection (e.g. a single conductor propagating the different incoming/outgoing signals) crossing the insulating thermal enclosure) in order to propagate both an RF signal and an LF signal can minimise the number of openings present in the enclosure. In this way, heat loss is reduced, which in turn reduces the energy consumption related to heating the enclosure.

According to an embodiment, the RF resonator further comprises within the insulating thermal enclosure:
- an RF path on which the RF signals propagate and on which said at least one resonant element is implemented, the RF path comprising decoupling means blocking the LF electric components.

Thus the LF signals are routed to the corresponding LF paths. Such decoupling means comprise for example one (or more) capacitors.

According to an embodiment, the decoupling means comprise said at least one resonant element. Thus, LF/RF decoupling is achieved in a simple and efficient way. For example, a resonant element of the MEMS, piezoelectric, SAW or BAW type is used, as such resonant elements naturally exhibit a capacitive effect at LF.

According to an embodiment, the RF resonator further comprises within the insulating thermal enclosure:
- a first LF path on which the LF electric power signal propagates and on which said at least one heating element is implemented, the first LF path comprising at least one first trap circuit blocking the RF electric components; and/or
- a second LF path on which the LF electric measurement signal propagates and on which said at least one temperature sensor is implemented, the second LF path comprising at least one second trap circuit blocking the RF electric components.

Thus the RF signals are routed to the corresponding LF path of the resonator. For example, the trap circuit(s) comprise(s) an inductor, implemented as a discrete element or in a distributed form (e.g. via a section of printed circuit board acting as an inductor at RF frequencies). The trap circuit(s) can also be implemented as a higher order filter circuit with better rejection at a given RF frequency than a single inductor.

According to one embodiment, a first extremity of the RF path and a first extremity of the first LF path are electrically connected to a first input/output port through the insulating thermal enclosure; and/or a second extremity of the RF path and a first extremity of the second LF path are electrically connected to a second input/output port crossing the insulating thermal enclosure.

According to one embodiment, the RF resonator comprises the first LF path and said second LF path. A second extremity of the first LF path and a second extremity of the second LF path are electrically connected to a third input/output port crossing the insulating thermal enclosure.

Thus, the number of openings present in the enclosure 110 is further reduced, and thus the thermal losses as well.

In an embodiment of the invention, an RF oscillator comprising an RF resonator according to any of the above-mentioned embodiments is provided.

According to some embodiments, the RF resonator of the RF oscillator comprises the first LF path and/or the second LF path (according to any one of the aforementioned embodiments wherein the RF resonator comprises the first and/or second LF path in question). In these embodiments:
- the first input/output port is electrically connected to both at least:
  - a first extremity of an oscillator RF path propagating the RF input signal, respectively the RF output signal, the first extremity of the oscillator RF path comprising first decoupling means blocking the LF electric components; and
  - a first oscillator LF path propagating the LF electric power signal, the first oscillator LF path comprising at least one first trap circuit of the oscillator blocking the RF electric components; and/or
- the second input/output port is electrically connected to both at least:
  - a second extremity of the oscillator RF path propagating the RF output signal, respectively the RF input signal, the second extremity of the oscillator RF path comprising second decoupling means blocking the LF electric components; and
  - a second oscillator LF path propagating the LF electric measurement signal, the second oscillator LF path comprising at least one second oscillator trap circuit blocking the RF electric components.

According to some embodiments, the second extremity of the first LF path of the RF resonator and the second extremity of the second LF path of the RF resonator are electrically connected to a third input/output port crossing the insulating thermal enclosure. In the relevant embodiments, the third input/output port is electrically connected to an electrical ground of the RF oscillator.

LIST OF FIGURES

Other purposes, features and advantages of the invention will become more apparent upon reading the following description, hereby given to serve as an illustrative and non-restrictive example, in relation to the figures, among which.

DETAILED DESCRIPTION OF THE EMBODIMENTS OF THE INVENTION

The general principle of the invention is based on the reuse of one (or more) input/output ports of a temperature-controlled RF resonator to propagate both an RF signal (e.g. the RF input signal 120e or the RF output signal 120s) and an LF signal (e.g. the LF electric power signal 130ali or the LF electric measurement signal 140mes) used by some of the elements present inside the insulating thermal enclosure of the RF resonator. In this way, heat loss is reduced, which in turn reduces the energy consumption related to heating the enclosure.

Figure 2:
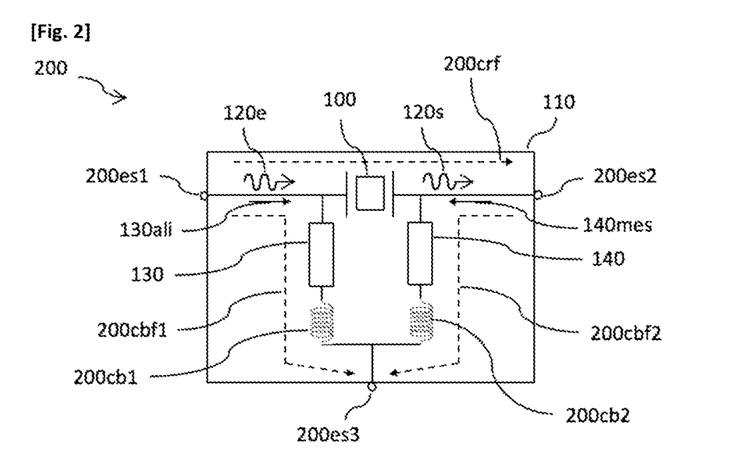
FIG. 2 illustrates a temperature-controlled RF resonator according to an embodiment of the invention.

In relation to FIG. 2, a temperature-controlled RF resonator 200 according to an embodiment of the invention is now presented.

The RF resonator 200 uses some of the constituent elements of the RF resonator 100 discussed above in connection with FIG. 1. More particularly, the RF resonator 200 also includes an insulating thermal enclosure 110 within which are implemented:

a resonant element 120 configured to deliver the RF output signal 120s when supplied with the RF input signal 120e. As discussed above in connection with FIG. 1, the RF output signal 120s corresponds to the RF input signal 120e filtered around the resonant frequency RF of the resonant element 120. In other embodiments, several resonant elements are used to improve RF signal filtering, and thus noise performance even though the solution size is impacted.

Returning to FIG. 2, inside the enclosure 110, is also implemented:

- a heating element 130 configured to supply thermal energy within the thermal enclosure 110 when the heating element 130 is powered by the LF electric power signal 130ali. As discussed above in relation to FIG. 1, the heating element 130 is a resistor for example that produces heat by Joule effect when an electric current passes through it that corresponds in this case to the electric signal 130ali. In other embodiments, several heating elements are used, for example in a distributed manner within the enclosure 110 to provide a uniform temperature.

Returning to FIG. 2, inside the enclosure 110, is also implemented:

a temperature sensor 140 configured to deliver an LF electric measurement signal 140mes proportional to a temperature inside the thermal enclosure 110. As discussed above in relation to FIG. 1, the temperature sensor 140 is, for example, a temperature-dependent variable resistor. The LF electric measurement signal 140mes is, in this case, a current whose intensity is a function of the temperature when the temperature sensor 140 is subjected to a given potential difference. In other embodiments, several temperature sensors are used, for example in a distributed manner within the enclosure 110 to provide a better temperature estimate.

Returning to FIG. 2, the RF resonator 200 includes two input/output ports, 200es1 and 200es2, crossing the insulating thermal enclosure 110, each of said two input/output ports propagating an RF signal, 120e or 120s, and an LF signal, 130ali or 140mes. Thus, the reuse of the input/output ports 220es1, 200es2 to propagate both an RF signal, 120e or 120s, and an LF signal, 130ali or 140mes, can minimise the number of openings present in the enclosure 110. In this way, heat loss is reduced, which in turn reduces the energy consumption related to heating the enclosure 110. Indeed, the energy consumption is essentially linked to the power to be supplied to compensate for the thermal losses due to the various accesses between the interior and the exterior of the enclosure 110.

Such losses are of several origins, thermal conduction, radiation, convection. By way of comparison, the order of magnitude of the power consumption of an oscillation circuit may be a few tens to a few hundreds of microwatts while the power consumption of the elements present in the enclosure 110 is in the order of 100 mW.

Generally, in known industrial implementations the resonant element 120 is placed in a vacuum, thus limiting convection. The radiation is controlled by the lining of the housing surrounding the zone to be maintained at the set temperature. The thermal conduction is due to the various physical elements linking the zone to heat and the exterior of the enclosure 110. These elements are the electrical wires and the mechanical support. For example, a 25 μm diameter gold wire-bonding wire has a resistivity of 26 MK·W$^{-1}$·m$^{-1}$. This resistivity is divided by the number of wires required to implement the resonator. For example, if we consider a mechanical glass support with a thickness of 100 μm on a surface of 400 μm×100 μm, a thermal resistance of 2.5 kK·W$^{-1}$ is obtained, giving an equivalent resistance of 1.9 kK·W$^{-1}$·m$^{-1}$ with three 1 mm long wires (configuration in FIG. 2 for example) and 1.7 kK·W$^{-1}$·m$^{-1}$ with five wires still 1 mm long (configuration in FIG. 1 for example). The power consumption with five wires can thus be estimated at 85.5 mW in the case of a temperature variation of 145 K inside the enclosure 110, and that of the configuration with three wires at 75 mW, that is a 12% reduction in power consumption by going from five input/output ports to three input/output ports. The same calculation done for 100 μm long wires gives a 33% reduction in power consumption when going from five input/output ports to three input/output ports.

In addition, the start-up time (i.e. the time needed to bring the elements of the RF 200 resonator to the desired temperature and thus to correctly stabilise its resonant frequency at the desired frequency) is related to the thermal mass of the RF 200 resonator, and thus to thermal leaks among other things. The start-up time of the RF resonator 200 is thus also reduced compared to the start-up time of the known RF resonator 100.

In other embodiments, a single input/output port is reused to propagate both an RF signal and an LF signal through the enclosure 110. In this case, a gain is still obtained in terms of thermal losses, although to a lesser extent, compared to the case of FIG. 2 where several input/output ports are reused.

Returning to FIG. 2, the input/output port 200es1 propagates both the RF input signal 120e and the LF electric power signal 130ali. To do this, a first extremity of the RF path 200crf (the RF path 200crf being the path on which the resonant element 120 is implemented and along which the RF signal propagates within the enclosure 110 as illustrated by the dotted arrow 200*crf* in the figures) and a first extremity of the first LF path 200*cbf*1 (the first LF path 200*cbf*1 being the path on which the heating element 130 is implemented and along which the LF electric power signal 130*ali* propagates within the enclosure 110) as illustrated by the dotted arrow 200*cbf*1 in the figures) are electrically connected to the input/output port 200*es*1.

Similarly, the input/output port 200*es*2 propagates both the RF output signal 120*s* and the LF electric measurement signal 140*mes*. To do this, a second extremity of the RF path 200*crf* and a first extremity of the second LF path 200*cbf*2 (the second LF path 200*cbf*2 being the path on which the temperature sensor 140 is implemented and on which the LF electric measurement signal 140*mes* propagates within the enclosure 110 as illustrated by the dotted arrow 200*cbf*2 in the figures) are electrically connected to the input/output port 200*es*1.

In other embodiments, the role of the RF ports of the RF resonator 200 are reversed, with the RF resonator 200 being symmetrical from the point of view of its RF path 200*crf*. In this case, one input/output port propagates both the RF output signal and the LF electric power signal, and another input/output port propagates both the RF input signal 120*e* and the LF electric measurement signal 140*mes*.

Returning to FIG. 2, the RF path 200*crf* includes decoupling means blocking the LF electric components. In this way, the LF electric power signal 130*ali* is routed to the first LF path 200*cbf*1. Similarly, the LF electric measurement signal 140*mes* is routed to the second LF path 200*cbf*2.

In the embodiment considered, the decoupling means in question comprise the resonant element 120 itself. Indeed, some resonant elements such as MEMS, piezoelectric, SAW or BAW have a natural capacitive effect to block the LF electric components. In other embodiments, the decoupling means comprises one (or more) capacitors, for example implemented in the form of a discrete element. In other embodiments, the decoupling means comprise a higher order high-pass circuit for improved rejection of certain LF frequencies.

Returning to FIG. 2, the first LF path 200*cbf*1 includes a first trap circuit 200*cb*1 blocking the LF electric components. Similarly, the second LF path 200*cbf*2 includes a second trap circuit 200*cb*2 also blocking the RF electric components. Thus, the RF signals 100*e* and 100*s* are routed to the LF path 200*crf*.

In the present embodiment, the first 200*cb*1 and second 200*cb*2 trap circuits comprise an inductor, implemented as a discrete element or in a distributed form (e.g. via a section of printed circuit board acting as an inductor at RF frequencies). In other embodiments, the first trap circuit 200*cb*1 and/or the second trap circuit 200*cb*2 comprises a plurality of elements (discrete or distributed) to provide a higher order filter circuit having better rejection at a given RF frequency than a single inductor.

Returning to FIG. 2, a second extremity of the first BF path 200*cbf*1 and a second extremity of the second BF path 200*cbf*2 are electrically connected to a third input/output port 200*es*3. Thus, the number of openings present in the enclosure 110 is further reduced, as well as the thermal losses. In other embodiments, multiple input/output ports are used to implement the return path to the outside of the enclosure 110 of the various LF signals implemented in the RF resonator 200.

Figure 3:
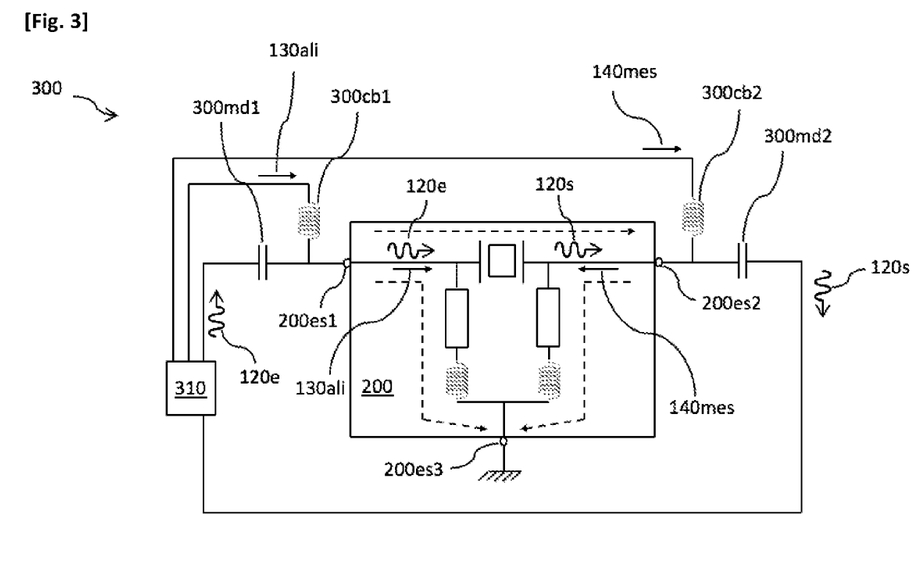
FIG. 3 illustrates an RF oscillator comprising the temperature-controlled RF resonator of FIG. 2 according to an embodiment of the invention.

In relation to FIG. 3, an RF oscillator 300 comprising the RF resonator 200 is now presented.

More particularly, the RF resonator 200 allows the oscillation signal maintained by the active part 310 of the oscillator to be filtered in order to achieve good performance, for example in terms of phase noise.

In addition, the active part 310 also measures the LF electric measurement signal 140*mes* delivered by the temperature sensor 140 and generates the LF electric power signal 130*ali* of the heating element 130 according to the measured value for the electric signal 140*mes*. In other embodiments, the measurement of the LF electric signal 140*mes* and generation of the LF electric signal 130*ali* functions are offset from the dedicated active part 310 as such in this case to the generation and maintenance of RF oscillations.

Returning to FIG. 3, the input/output port 200*es*1 is electrically connected to both:
  a first extremity of an RF path of the oscillator 300 propagating the RF input signal 120*e* and comprising first decoupling means 300*md*1 blocking the LF electric components; and
  a first LF path of the oscillator 300 propagating the LF electric power signal 130*ali* and comprising a first trap circuit 300*cb*1 of the oscillator 300 blocking the RF electric components. Further, the input/output port 200*es*2 is electrically connected to both:
  a second extremity of the RF path of the oscillator 300 propagating the RF output signal 120*s* and comprising second decoupling means 300*md*2 blocking the LF electric components; and
  a second LF path of the oscillator 300 propagating the LF electric measurement signal 140*mes* and comprising a second trap circuit 300*cb*2 of the oscillator 300 blocking the RF electric components.

In the embodiment considered, the first 300*cb*1 and second 300*cb*2 trap circuits of the oscillator 300 comprise an inductor, implemented as a discrete element or in a distributed form (e.g., via a section of printed circuit board acting as an inductor at RF frequencies). In other embodiments, the first trap circuit 300*cb*1 of the oscillator 300 and/or the second trap circuit 300*cb*2 of the oscillator 300 comprises a plurality of elements (discrete or distributed) to provide a higher order filter circuit presenting a better rejection at a given RF frequency than a simple inductor.

Returning to FIG. 3, the first 300*md*1 and second 300*md*2 decoupling means comprise one (or more) capacitors, for example implemented as a discrete element. In other embodiments, the first decoupling means 300*md*1 and/or the second decoupling means 300*md*2 are implemented as a higher order high-pass circuit allowing for an improved rejection of certain LF frequencies.

In the aforementioned embodiments of the RF resonator 200 in which a single input/output port is reused to propagate both an RF signal and an LF signal through the enclosure 110, only the input/output port in question is connected to both the RF path of the oscillator 300 and to one of its LF paths via the corresponding means described above. The other input/output ports are connected to the corresponding RF or LF path in a known manner.

Returning to FIG. 3, the input/output port 200*es*3 is electrically connected to the electrical ground of the oscillator 300.

In the aforementioned embodiments in which several input/output ports are used to implement the return path, to the exterior of the enclosure 110, of all or part of the different LF signals implemented in the RF resonator 200, the input/output ports in question are each connected electrically to the electrical ground of the oscillator 300.

Figure 4A:
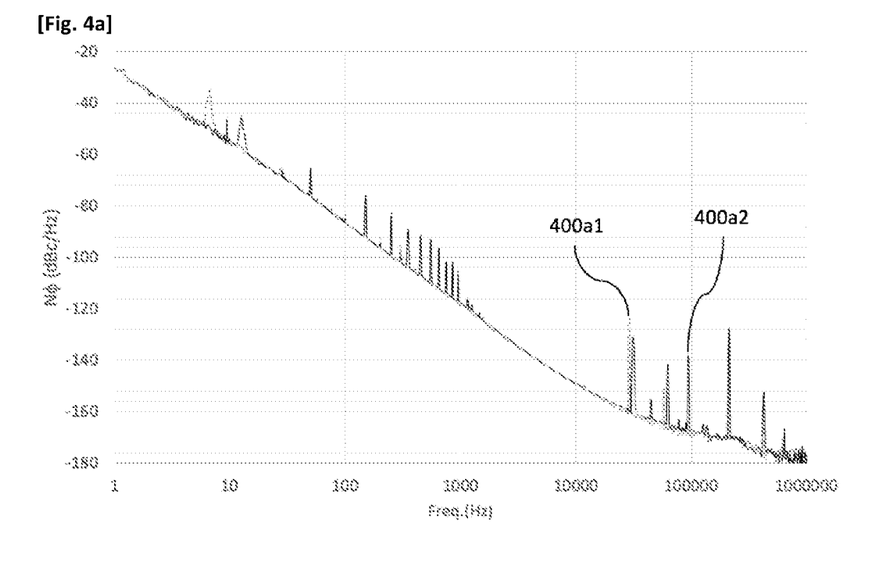
FIG. 4a and [FIG. 4b] illustrate the phase noise performance obtained for the oscillator of FIG. 3 relative to an oscillator comprising the known RF resonator of FIG. 1.
Figure 4B:
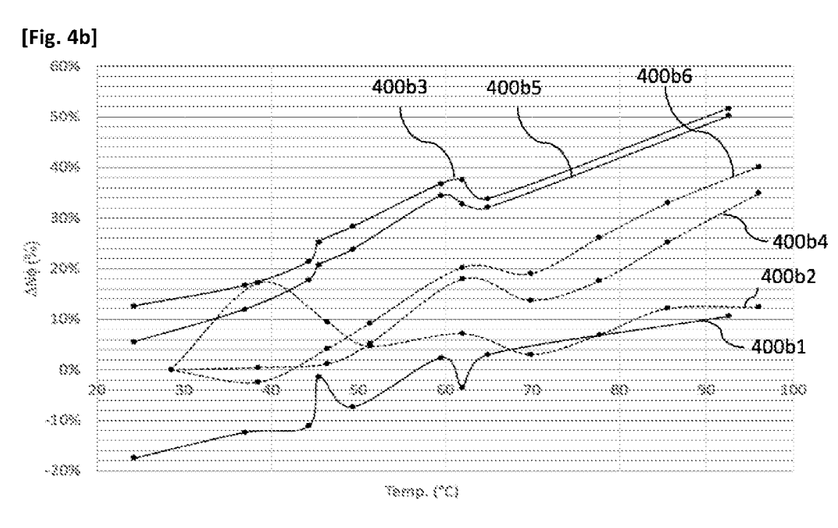

In relation to FIG. 4a and FIG. 4b certain phase noise performances (N φ)) obtained for the oscillator 300 in a configuration where it is configured to resonate at 418 MHz are now presented.

More specifically:
- curve 400a2 (FIG. 4a) illustrates the phase noise measured for the oscillator 300 as a function of the frequency offset from the resonant frequency of the resonator 200 and for a given temperature inside the enclosure 110 (here 62° C.); and
- curve 400a1 (FIG. 4a) illustrates the phase noise measured for a reference oscillator having the same constituent elements as the oscillator 300 except for the known RF resonator 100 which is used instead of the RF resonator 200. Here, the phase noise is also measured as a function of the frequency offset from the resonant frequency of the resonator 100 and for the same given temperature inside the enclosure 110 (here 62° C.).

By comparing the curves 400a1 and 400a2, it is noted that the degradation of the phase noise performance of the oscillator 300 remains marginal (i.e. less than 20% in practice) compared to the reference oscillator. This result remains valid despite the presence of the different additional elements implemented in the resonator 200 and in the oscillator 300 (trap circuits 200cb1, 200cb2, 300cb1, 300cb2 and decoupling means 300md1, 300md2).

The same conclusion can be drawn by observing the phase noise performance obtained as a function of the temperature inside the enclosure 110. More specifically:
- the curves 400b1 and 400b2 (FIG. 4b) illustrate the phase noise measured respectively for the oscillator 300 and for the reference oscillator, at 100 Hz offset from the resonance frequency of the resonator implemented in the oscillator in question, and as a function of temperature (each of the curves 400b1 and 400b2 is normalised with respect to the value of the curve 400b2 at 28.5° C.);
- the curves 400b3 and 400b4 (FIG. 4b) illustrate the phase noise measured respectively for the oscillator 300 and for the reference oscillator at 1 kHz offset from the resonance frequency of the resonator implemented in the oscillator in question, and as a function of temperature (each of curves 400b3 and 400b4 is normalised with respect to the value of curve 400b4 at 28.5° C.);
- the curves 400b5 and 400b6 (FIG. 4b) illustrate the phase noise measured respectively for the oscillator 300 and for the reference oscillator at 10 kHz offset from the resonant frequency of the resonator implemented in the oscillator in question, and as a function of temperature (each of curves 400b5 and 400b6 is normalised with respect to the value of curve 400b6 at 28.5° C.).

By comparing curves 400b1 and 400b2 with each other, then curves 400b3 and 400b4 and finally curves 400b5 and 400b6, it is noted that the degradation of the phase noise performance of the oscillator 300 remains marginal here (i.e. less than 20% in practice) with respect to the reference oscillator irrespective of the temperature considered inside the enclosure 110.

The invention claimed is:

1. A temperature-controlled radio frequency (RF) resonator comprising:
an insulating thermal enclosure within which are implemented:
at least one resonant element configured to provide an RF output signal when fed with an RF input signal, said RF output signal corresponding to said RF input signal filtered around a resonant frequency of said at least one resonant element;
at least one heating element configured to supply thermal energy within the thermal enclosure when said at least one heating element is powered by a low frequency (LF) electric power signal; and
at least one temperature sensor configured to deliver an LF electric measurement signal as a function of the temperature inside the thermal enclosure; and
at least one input/output port crossing said insulating thermal enclosure, said at least one input/output port propagating at least:
one signal from among said RF input and output signals; and
another signal from among said LF electric power and measurement signals,
wherein said insulating thermal enclosure comprises an RF path on which said RF input and output signals propagate and on which said at least one resonant element is implemented, said RF path comprising a decoupling element blocking LF electric components of the LF electric power and measurement signals.

2. The temperature-controlled RF resonator according to claim 1 wherein said decoupling element comprises said at least one resonant element.

3. The temperature-controlled RF resonator according to claim 1 further comprising within said insulating thermal enclosure:
a first LF path on which the LF electric power signal propagates and on which said at least one heating element is implemented, the first LF path comprising at least one first trap circuit blocking RF electric components of the RF input and output signals; and/or
a second LF path on which said LF electric measurement signal propagates and on which said at least one temperature sensor is implemented, the second LF path comprising at least one second trap circuit blocking RF electric components of the RF input and output signals.

4. The temperature-controlled RF resonator according to claim 3 wherein:
a first extremity of said RF path and a first extremity of said first LF path are electrically connected to a first input/output port crossing said insulating thermal enclosure; and/or
a second extremity of said RF path and a first extremity of said second LF path are electrically connected to a second input/output port crossing said insulating thermal enclosure.

5. The temperature-controlled RF resonator according to claim 3, wherein an extremity of said first LF path and an extremity of said second LF path are electrically connected to an input/output port of the at least one input/output port crossing said insulating thermal enclosure.

6. A radio frequency (RF) oscillator comprising:
a temperature-controlled RF resonator comprising:
an insulating thermal enclosure within which are implemented:
at least one resonant element configured to provide an RF output signal when fed with an RF input signal, said RF output signal corresponding to said RF input signal filtered around a resonant frequency of said at least one resonant element;
at least one heating element configured to supply thermal energy within the thermal enclosure when said at least one heating element is powered by a low frequency (LF) electric power signal; and at least one temperature sensor configured to deliver an LF electric measurement signal as a function of the temperature inside the thermal enclosure; and at least one input/output port crossing said insulating thermal enclosure, said at least one input/output port propagating at least:
one signal from among said RF input and output signals; and
another signal from among said LF electric power and measurement signals, wherein said insulating thermal enclosure comprises an RF path on which said RF input and output signals propagate and on which said at least one resonant element is implemented, said RF path comprising a decoupling element blocking LF electric components of the LF electric power and measurement signals.

7. The RF oscillator according to claim 6 wherein:
a first of the at least one input/output port is electrically connected to both at least:
  a first extremity of an RF path of said oscillator propagating said RF input signal, respectively said RF output signal, said first extremity of said RF path of said oscillator comprising a first decoupling element blocking the LF electric components; and
  a first LF path of said oscillator propagating said LF electric power signal, said first LF path of said oscillator comprising at least one first trap circuit of said oscillator blocking RF electric components of the RF input and output signals; and/or a second of the at least one input/output port is electrically connected to both at least:
  a second extremity of said RF path of said oscillator propagating said RF output signal, respectively the RF input signal, said second extremity of said RF path of said oscillator comprising second decoupling element blocking second LF electric components; and
  a second LF path of said oscillator propagating said LF electric measurement signal, said second LF path of said oscillator comprising at least one second trap circuit of said oscillator blocking the RF electric components.

8. The temperature-controlled RF oscillator according to claim 7,
wherein said RF resonator comprises said first LF path and said second LF path, wherein a first extremity of said first LF path and a second extremity of said second LF path are electrically connected to a third of the at least one input/output port crossing said insulating thermal enclosure, and
wherein said third input/output port is electrically connected to an electrical ground of said RF oscillator.

* * * * *